United States Patent
Kawamura et al.

(10) Patent No.: US 8,248,744 B2
(45) Date of Patent: Aug. 21, 2012

(54) VOLTAGE DETECTING APPARATUS

(75) Inventors: Yoshihiro Kawamura, Shizuoka (JP); Toshiaki Takeshita, Saitama (JP); Mitsuteru Yano, Saitama (JP)

(73) Assignees: Yazaki Corporation, Tokyo (JP); Honda Motor Co., Ltd., Tokyo (JP)

( * ) Notice: Subject to any disclaimer, the term of this patent is extended or adjusted under 35 U.S.C. 154(b) by 257 days.

(21) Appl. No.: 12/123,717

(22) Filed: May 20, 2008

(65) Prior Publication Data

US 2008/0310063 A1 Dec. 18, 2008

(30) Foreign Application Priority Data

Jun. 18, 2007 (JP) ................. 2007-160321

(51) Int. Cl.
*H02H 3/00* (2006.01)
(52) U.S. Cl. ........................................ 361/79
(58) Field of Classification Search ........ 361/79
See application file for complete search history.

(56) References Cited

U.S. PATENT DOCUMENTS

| | | | | |
|---|---|---|---|---|
| 3,761,799 A | * | 9/1973 | Shuey | 323/270 |
| 3,781,637 A | * | 12/1973 | Potter | 363/27 |
| 5,113,840 A | * | 5/1992 | Taruya et al. | 123/644 |
| 5,465,190 A | * | 11/1995 | Meunier et al. | 361/91.5 |
| 6,225,826 B1 | * | 5/2001 | Krishnamurthy et al. | 326/93 |
| 6,437,648 B1 | * | 8/2002 | Van Beylen | 330/297 |
| 6,639,409 B2 | * | 10/2003 | Morimoto et al. | 324/434 |
| 6,803,766 B2 | * | 10/2004 | Kobayashi et al. | 324/434 |
| 7,602,144 B2 | * | 10/2009 | Seo | 320/116 |

FOREIGN PATENT DOCUMENTS

| | | |
|---|---|---|
| JP | 2003-249403 | 9/2003 |
| JP | 2004-170146 A1 | 6/2004 |
| JP | 2006-177782 | 7/2006 |
| JP | 2006-337130 | 12/2006 |
| JP | 2007-114173 | 5/2007 |

OTHER PUBLICATIONS

Japanese Office Action issued for counterpart Japanese Patent Application No. 2007-160321 dated May 10, 2011.

\* cited by examiner

*Primary Examiner* — Jared Fureman
*Assistant Examiner* — Scott Bauer
(74) *Attorney, Agent, or Firm* — Kratz, Quintos & Hanson, LLP

(57) ABSTRACT

The present invention is to provide a voltage detecting apparatus, which can downsize a circuit, reduce costs and detect a voltage with high accuracy, the voltage detecting apparatus to detect a voltage by using a flying capacitor. Furthermore, the voltage detecting apparatus does not halt whole functions. The first zener diode is connected to the first resistor R1, which divides a voltage stored with the capacitor as a flying capacitor into a detectable voltage at a microcomputer, in parallel. Furthermore, the voltage detecting apparatus prevents more than a zener voltage of the first zener diode from applying to the input of the microcomputer.

6 Claims, 5 Drawing Sheets

VOLTAGE DETECTING APPARATUS

The priority application Number Japan Patent Application No. 2007-160321 upon which this patent application is based is hereby incorporated by reference.

BACKGROUND OF THE INVENTION

1. Field of the Invention

The present invention relates to a voltage detecting apparatus and especially to a voltage detecting apparatus detecting voltage of direct-current power source (here after, DC power source).

2. Description of the Related Art

Usually, as a voltage detecting apparatus detecting voltage of DC power source, there is an insulation detecting apparatus of Flying Capacitor method. For detecting an insulating condition of an insulation condition of the high-voltage DC power source, a value of earth-fault resistance is calculated based on a measured value of a voltage between both terminals of an ungrounded capacitor (i.e. flying capacitor) charged with a voltage of the high-voltage power source and a measured value of a voltage between both terminals of the capacity, one terminal of which is grounded through a resistor, similarly charged with the voltage of the high-voltage power source. Thereby, the insulation condition of the high-voltage power source can be detected (for example, see patent document 1).

The insulation detecting apparatus described in the patent document 1 charges a voltage to a capacitor, and detects a malfunction of a switch on a circuit for measuring a voltage between both terminals of the capacitor.

FIG. 5 is a circuit diagram of the insulation detecting apparatus described in the patent document 1. As shown in FIG. 5, the power source 3 is formed by connecting plural batteries from V1 to Vn in series. The power source 3 is insulated from a ground electric potential 7 of a low-voltage system, such as a microcomputer 11.

The insulation detecting apparatus of FIG. 5 has a bipolar type capacitor 9, a first switch S1 and a second switch S2. The first switch S1 connects a positive electrode of the power source 3 insulated from on the ground electric potential 7 to one terminal of the capacitor 9. The second switch S2 connects a negative electrode of the power source 3 to the other terminal of the capacitor 9.

A microcomputer 11 includes a voltage measuring function which converts a provided voltage into an input port A/D analog-to-digital and measures the voltage. The insulation detecting apparatus has a third switch S3 and a fourth switch S4. The third switch S3 connects the one terminal of the capacitor 9 to the input port A/D. The fourth switch S4 connects the other terminal of the capacitor 9 to the ground electric potential 7.

A first diode D1, a first resistor R1 and the capacitor 9 are connected in series from a point between the first switch S1 and the third switch S3 to a point between the second switch S2 and the fourth switch S4. A second diode D2 and a second resistor R2 are connected in series from a point between the first resistor R1 and the capacitor 9 to a point between the first switch S1 and the third switch S3. That is, the first diode D1/the first resistor R1 and the second diode D2/the second resistor R2 are connected in parallel.

A third resistor R3 is connected between a terminal, at side of the input port A/D, of the third switch S3 and the ground electric potential 7. A fourth resistor R4 is connected between a terminal, at side of the ground electric potential 7, of the fourth switch S4 and the ground electric potential 7.

The above mentioned first-fourth switches S1-S4 are applied with an optical MOSFET. These switches are insulated from the power source 3 and can be controlled by the microcomputer 11.

A fifth switch S5 is connected from a point between the second diode D2 and the second resistor R2 to the ground electric potential 7. The fifth switch S5 and a fifth resistor R5 are connected in series. The fifth resistor R5 is lower about resistance than the second resistor R2.

A malfunction detecting action of a switch of the insulation detecting apparatus having the above construction is explained. Regarding the first switch S1, in condition of making the other switches open, the second switch S2 is closed during a closed circuit time T1. When the first switch S1 is in an abnormal condition, for example, a closed circuit condition or a short circuit condition due to malfunction or etc, a circuit connecting the capacitor 9 to the power source 3 in series is formed. Thereby, during the closed circuit time T1, the capacitor 9 is charged and voltage VC between both terminals of the capacitor 9 increases. Therefore, when the third switch S3 and the fourth switch S4 are closed and the microcomputer 11 reads the voltage VC between both terminals of the capacitor 9 through A/D port (input port A/D), since the capacitor 9 is charged by abnormality of the first switch S1, the voltage VC between both terminals of the capacitor 9 is detected by the microcomputer 11. Since the voltage VC between both ends terminal of the capacitor 9 is detected, the microcomputer 11 judges that the first switch S1 is in abnormal condition.

Regarding the second switch S2, in condition of making the other switches open, the first switch S1 is closed during the closed circuit time T1. When the second switch S2 is in an abnormal condition, for example, a closed circuit condition or a short circuit condition due to malfunction, a circuit connecting the capacitor 9 to the power source 3 in series is formed. Thereby, during the closed circuit time T1, the capacitor 9 is charged and the voltage VC between both terminals of the capacitor 9 increases. Therefore, when the third switch S3 and the fourth switch S4 are closed and the microcomputer 11 reads the voltage VC between both terminals of the capacitor 9 through the A/D port, since the capacitor 9 is charged by abnormality of the first switch S1, the voltage VC between both terminals of the capacitor 9 is detected by the microcomputer 11. Since the voltage VC between both terminals of the capacitor 9 is detected, the microcomputer 11 judges that the second switch S2 is in the abnormal condition.

Regarding the third switch S3, in a condition of making the other switches open, the first switch S1 and the second switch S2 are closed during the closed circuit time T1. That is, a circuit connecting the capacitor 9 to the power source 3 in series is formed, and the capacitor 9 is charged during the closed circuit time T1. Thereby, the voltage VC of between both terminals of the capacitor 9 increases. After elapsing the closed circuit time T1, when furthermore a prescribed time tw1 shorter than closed circuit time T1 passes, in conditions that in conditions that shutting the third switch S3 off, the fourth switch S4 is closed for detecting an abnormality of the third switch S3. When the third switch S3 is in an abnormal condition, for example, a closed circuit condition or a short circuit condition due to malfunction, a circuit, which is connected with the microcomputer 11 detecting voltage VC between both ends terminal of the capacitor 9, is formed. Therewith, a discharge circuit from the capacitor 9 including the second resistor R2, the third resistor R3 and the fourth resistor R4 is formed. Therefore, when the microcomputer 11 reads the voltage VC between both terminals of the capacitor 9 through the A/D port, the A/D port of microcomputer 11 is applied the voltage VC between both terminals of the capacitor 9 by abnormality of the third switch S3. Thereby, the voltage VC between both terminals of the capacitor 9 is detected by the microcomputer 11. Since the voltage VC between both terminals of the capacitor 9 is detected, the microcomputer 11 judges that the third switch S3 is in the abnormal condition.

Regarding the fourth switch S4, in a condition of making other switches open, the first switch S1 and the second switch S2 are closed during the closed circuit time T1. That is, a circuit connecting the capacitor 9 to the power source 3 in series is formed. Thereby, the capacitor 9 is charged during the closed circuit time T1. After elapsing closed circuit time T1, furthermore after a prescribed time tw1 shorter than closed circuit time T1 passes, abnormality of the fourth switch S4 is detected. Thereby in condition of shutting the fourth switch S4 off, the third switch S3 is closed. When the fourth switch S4 is in an abnormal condition, for example, a closed circuit condition or a short circuit condition due to malfunction, a circuit, which is connected to the microcomputer 11 detecting the voltage VC between both terminals of the capacitor 9 is formed. Therewith, a discharge circuit from the capacitor 9 including the second resistor R2, the third resistor R3 and the fourth resistor R4 is formed. Therefore, when the microcomputer 11 reads the voltage VC between both terminals of the capacitor 9 through A/D port, the A/D port of the microcomputer 11 is applied the voltage VC between both terminals of the capacitor 9 by abnormality of the fourth switch S4. Thereby, the voltage of VC between both terminals of the capacitor 9 is detected by the microcomputer 11. Since the voltage VC between both terminals of the capacitor 9 is detected, the microcomputer 11 judges that the fourth switch S4 is in the abnormal condition.

After the above mentioned malfunction detecting action of each switch and a voltage detecting action for measuring insulation resistance, the fifth switch S5 is closed in condition that the third switch S3 and the fourth switch S4 are closed, and an electric charge of capacitor 9 is discharged through the second resistor R2.

For detecting a malfunction of the fifth switch S5, the first switch S1 and the second switch S2 are closed during closed circuit time T1. When the fifth switch S5 is in the closed circuit condition or the short circuit condition by malfunction, an electric charge, which is charged in the capacitor 9, is discharged through the fifth switch S5, thereby the voltage between both terminals of the capacitor 9 does not increase. When the detected voltage VC between both terminals of the capacitor 9 is equal to or lower than a prescribed voltage, the microcomputer 11 judges that the fifth switch S5 is in the abnormal condition.

Patent Document 1:
Japan published patent application 2004-170146

SUMMARY OF THE INVENTION

Objects to Be Solved

In the above conventional voltage detecting apparatus, the circuit is supplied with high-voltage by the power source 3 while performing the malfunction detecting action of each switch. Therefore, it is required to design a circuit based on large-size parts and high rated-parts under the assumption that element of the circuit causes a malfunction.

Also, in a resistor used with the above conventional voltage detecting apparatus, a big lead resistor of high rated noncombustible exterior equipment has to be selected for avoiding secondary failure when the switch is in a malfunction. A lead resistor of noncombustible exterior equipment can not provide structurally high-precision objects. Therefore, it is difficult to miniaturize a circuit and to reduce costs. In addition to this, it is hard to detect a voltage with high-accuracy.

Furthermore, usually a voltage of the power source 3 is several hundred volts. On the other hand, input of the microcomputer 11 is maximum several volts. As a result, although a protecting circuit is provided on a voltage-division circuit and the microcomputer 11, it is possible that all functions stop by destruction of the stressed microcomputer 11 in a malfunction of switch.

According to the above problem, an object of the present invention is to provide a voltage detecting apparatus, which can downsize a circuit, reduce costs and detect a voltage with high accuracy, the voltage detecting apparatus to detect a voltage by using a flying capacitor. Furthermore, the voltage detecting apparatus does not halt whole functions.

How to Attain the Object of the Present Invention

According to a first aspect of the present invention, a voltage detecting apparatus has a DC power source insulated from a ground electric potential, a flying capacitor storing an electric charge from the DC power source, an input device connecting the flying capacitor with the DC power source, a voltage divider dividing a voltage across of the flying capacitor, an output device connecting the voltage divider with the flying capacitor, and a voltage detecting device detecting the voltage across of the flying capacitor divided by voltage divider. The input device has a current limiting device for preventing more than a prescribed current from flowing into the input device. The voltage divider has a protective device for preventing more than a prescribed voltage from applying to the voltage detecting device.

According to a second aspect of the present invention, the protective device is a zener diode.

According to a third aspect of the present invention, a zener voltage of the zener diode is larger than a maximum voltage detected by the voltage detecting device, and is equal to or smaller than a maximum voltage applied to the output device and the voltage divider.

According to a fourth aspect of the present invention, the current limiting device is covered with a case for preventing fragments from flying in all directions.

Effect of the Invention

According to the invention, since the voltage detecting apparatus has the current limiting device connecting the flying capacitor with the DC power source and the voltage divider including the protective device, a voltage more than a prescribed voltage is not applied to the voltage detecting device. Thereby, the microcomputer including the voltage detecting device is not destroyed. Also, it is unnecessary that an element including at least the voltage divider uses a lead resistor of noncombustible exterior equipment. Thereby, a cost can be reduced by increasing a detection accuracy of voltage and downsizing parts.

According to the invention, since the protective device has a zener diode, an upper limit voltage applied to the voltage detecting device can be determined by a zener voltage (breakdown voltage) of the zener diode.

According to the invention, since the zener voltage of the zener diode is larger than a maximum voltage detected by the voltage detecting device, and equal to or smaller than a maximum voltage applied to the output device and the voltage divider, decrease of voltage detection accuracy by leakage current of the zener diode can be avoided. Also, the voltage detecting device can be protected.

According to the invention, the current limiting device is covered with a case for preventing from flying a fragment in all directions. Thereby, even if the current limiting device is destroyed by high-voltage not less than a rated voltage, scatter of fragment can be prevented by the case, and plosive can be reduced by the case.

The above and other objects and features of this invention will become more apparent from the following description taken in conjunction with the accompanying drawings.

DESCRIPTION OF THE PREFERRED EMBODIMENT

Figure 1:
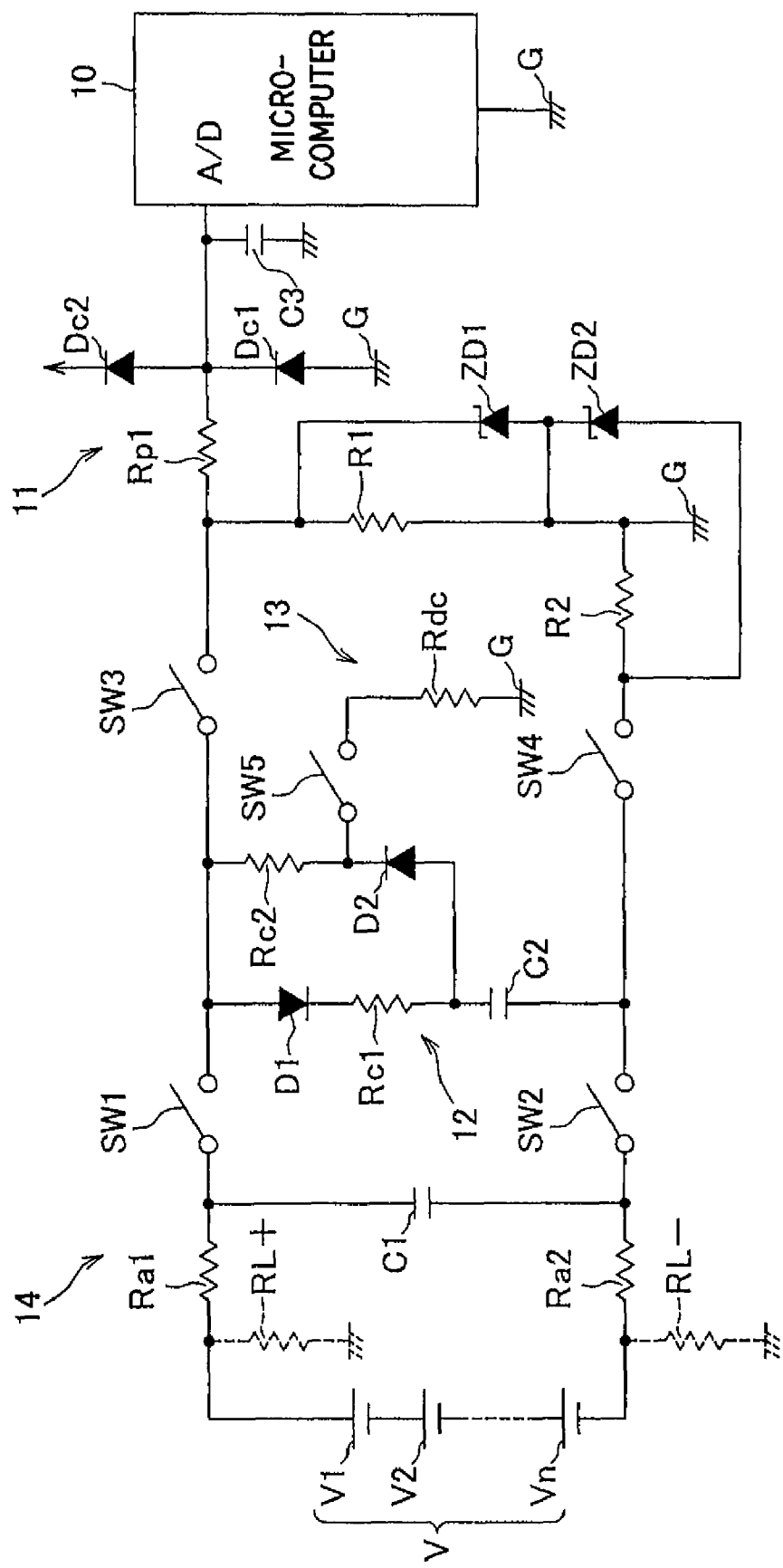
FIG. 1 is a circuit diagram showing an embodiment of a voltage detecting apparatus of the present invention.

Embodiments of the present invention are explained by referring to drawings. FIG. 1 is a circuit diagram of an embodiment of an insulation detecting apparatus as a voltage detecting apparatus of the present invention. A high-voltage power source V as a DC power source is formed by connecting batteries of numbers N in series and is insulated from a ground electric potential G of a low voltage system, including a microcomputer 11.

As shown in FIG. 1, the insulation detecting apparatus has a capacitor C2, a microcomputer 10, a first switch SW1, a second switch SW2, a third switch SW3, a fourth switch SW4, a first resistor R1, a second resistor R2, a first zener diode ZD1, a second zener diode ZD2, a microcomputer protecting circuit 11, a resistance select circuit 12, a reset circuit 13 and a input protecting circuit 14.

The capacitor C2 is a bipolar-type capacitor for measuring a voltage of the high-voltage power source V by a Flying Capacitor method.

The microcomputer 10 as a voltage detecting device contains a memory. Furthermore, the microcomputer 10 has a voltage detecting function, a ground resistance calculating function, a switch control function and a malfunction judging function for each switch. The voltage measurement function converts a provided voltage to an input terminal A/D analog-to-digital and detects the voltage. The ground resistance calculating function calculates a ground resistance by a prescribed formula and a conversion table with the measured voltage by voltage measurement function. The switch control function performs to open and close of each switch when performing the voltage measurement function.

The first switch SW1 connects a positive electrode of an insulated high-voltage power source V to one terminal of the capacitor C. The second switch SW2 connects a negative electrode of the high-voltage power source V to the other terminal of the capacitor C. That is, the first switch SW1 and the second switch SW2 correspond to the input device.

The third switch SW3 connects the one terminal of the capacitor C to the input terminal A/D. The fourth switch SW4 connects the other terminal of the capacitor C to the ground electric potential G. That is, the third switch SW3 and the fourth switch SW4 correspond to the output device.

For the each above mentioned first-fourth switches SW1-SW4, an optical MOSFET is used and insulated from a high-voltage power source V, and can be controlled by the microcomputer 10.

The first resistor R1 is arranged between a terminal, near side to the input terminal A/D, of the third switch SW3 and the ground electric potential G. The second resistor R2 is arranged between a terminal, near side to the ground electric potential G, of the fourth switch SW4 and the ground electric potential G. The first resistor R1 and the second resistor R2 correspond to the voltage divider. When the microcomputer 10 detects a voltage of the capacitor C2, the voltage divider converts the voltage of the capacitor C2 to a processable voltage in the microcomputer 10.

The first zener diode ZD1 is arranged in parallel with the first resistor R1, and connected in a forward direction from the ground electric potential G toward the third switch SW3. The second zener diode ZD2 is arranged in parallel with the second resistor R2, and connected in a forward direction from the third switch SW3 toward the first zener diode ZD1. The first zener diode ZD1 and the second zener diode ZD2 prevent input of the microcomputer protecting circuit 11 from being given at least a zener voltage of the zener diode. That is, the first zener diode ZD1 and the second zener diode ZD2 correspond to the protective device which preventing more than a prescribed voltage from applying to the microcomputer 10.

The microcomputer protecting circuit 11 has a protection resistor Rp1, a clamp diode Dc1,Dc2 and a capacitor C3. The input terminal A/D of the microcomputer 10 is supplied with a voltage through the microcomputer protecting circuit 11. The microcomputer protecting circuit 11 prevents the input terminal A/D of the microcomputer 10 from flowing an over current therethrough. Furthermore, the microcomputer protecting circuit 11 prevents the input terminal A/D of the microcomputer 10 from an excessive positive or negative voltage therein to possibly damage the microcomputer 10.

The resistance select circuit 12 has a first diode D1, a first select resistor Rc1, a second diode D2 and a second select resistor Rc2. The resistance select circuit 12 is arranged between a line connecting the first switch SW1 with the third switch SW3 and the capacitor C2.

The first diode D1 is connected in a forward direction from the line connecting the first switch SW1 and the third switch SW3 toward a capacitor C2. The first select resistor Rc1 is connected between the first diode D1 and the capacitor C2 in series.

The second diode D2 is connected in the forward direction from the capacitor C2 toward the line connecting the first switch SW1 and the third switch SW3. That is, the second diode D2 is connected in a direction opposite to that of the first diode D1. The second select resistor Rc2 is connected between the second diode D2 and the line connecting the first switch SW1 with the third switch SW3 in series.

The resistance select circuit 12 is formed by connecting two circuits in parallel. One of the two circuits connects the first diode D1 and the first select resistor Rc1 in series. The other of the two circuits connects the second diode D2 and the second select resistor Rc2 in series.

That is, the first diode D1 and the second diode D2 choose one from the first select resistor Rc1 and the second select resistor Rc2, which corresponds to a direction of polarity of the capacitor C2. Thereby, the selected select resistor is electrically connected between the line connecting the first switch SW1 with the third switch SW3 and the capacitor C2.

The reset circuit 13 has a reset switch SW5 and a discharge resistor Rdc. The reset switch SW5 is controlled by the microcomputer 10. When the reset switch SW5 is closed, an electric charge stored in the capacitor C can be discharged immediately.

The discharge resistor Rdc is set at a lower value than the first resistor R1, the second resistor R2 and the first select resistor Rc1.

The input protecting circuit 14 has a limiting resistor Ra1, Ra2 and a capacitor C1. A voltage of the high-voltage power source V is applied to the first switch SW1 and the second switch SW2 through the input protecting circuit 14. The input protecting circuit 14 prevents the first switch SW1 and the second switch SW2 from flowing an over current therethrough. That is, the input protecting circuit 14 corresponds to a current limiting device which prevents more than a prescribed current from flowing into the first switch SW1 and the second switch SW2.

Figure 2:
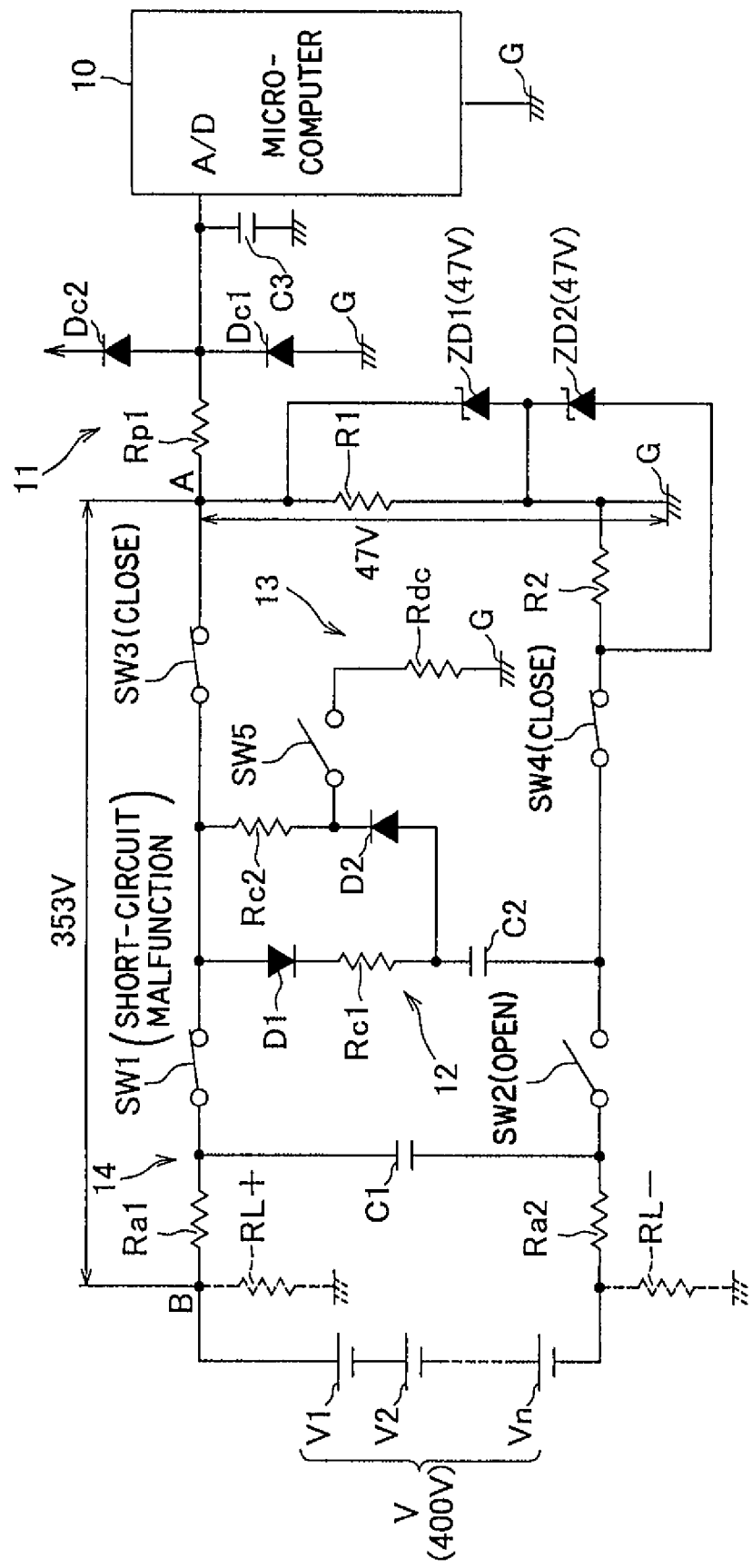
FIG. 2 illustrates that a first switch is in a short-circuit malfunction at the voltage detecting apparatus of FIG. 1.

Circuit action of a switch malfunction of the insulation detecting apparatus of the present invention having the above structure is explained by referring to FIG. 2.

In a circuit of FIG. 1, the high-voltage power source V is set to 400V, zener voltages of the first zener diode ZD1 and the second zener diode ZD2 are set to 47V, and a maximum detection voltage of the microcomputer 10 is set to 5V. In FIG. 2, a ground resistance of a negative electric potential side of the high-voltage power source V is set to 0Ω, the first switch SW1 causes a short-circuit malfunction, and the third switch SW3 and the fourth switch SW4 are closed. That is, the zener voltages of the zener diodes are higher than a maximum voltage which is detected by the voltage detecting device, and are equal to or smaller than a maximum voltage which is applied to the input device, the output device and the voltage divider.

In this instance, point A of FIG. 2 is limited to 47V of the zener voltage by effect of the zener diode ZD1. 400V−47V=353V is applied between the high-voltage power source V and point A (between points A and B). Therefore, maximum rating can perform at least 47V in a circuit element of the microcomputer protecting circuit 11. Also, when rating of the limiting resistor Ra1 on which energy of 353V concentrates is smaller than 353V, only the limiting resistor Ra1 causes an open malfunction. As a result, a connection from the high-voltage power source V is closed, and another circuit element does not cause a malfunction except the first switch SW1 which already is in a malfunction.

Furthermore, in order to prevent a damage of circuit elements except damaged first switch SW1 including the limiting resistor Ra1 of the open malfunction without additional parts, a resistor in which rating of only the limiting resistor Ra1 is increased (In other words, a resistor which is not destroyed even if 353V is applied) can be used.

Figure 3:
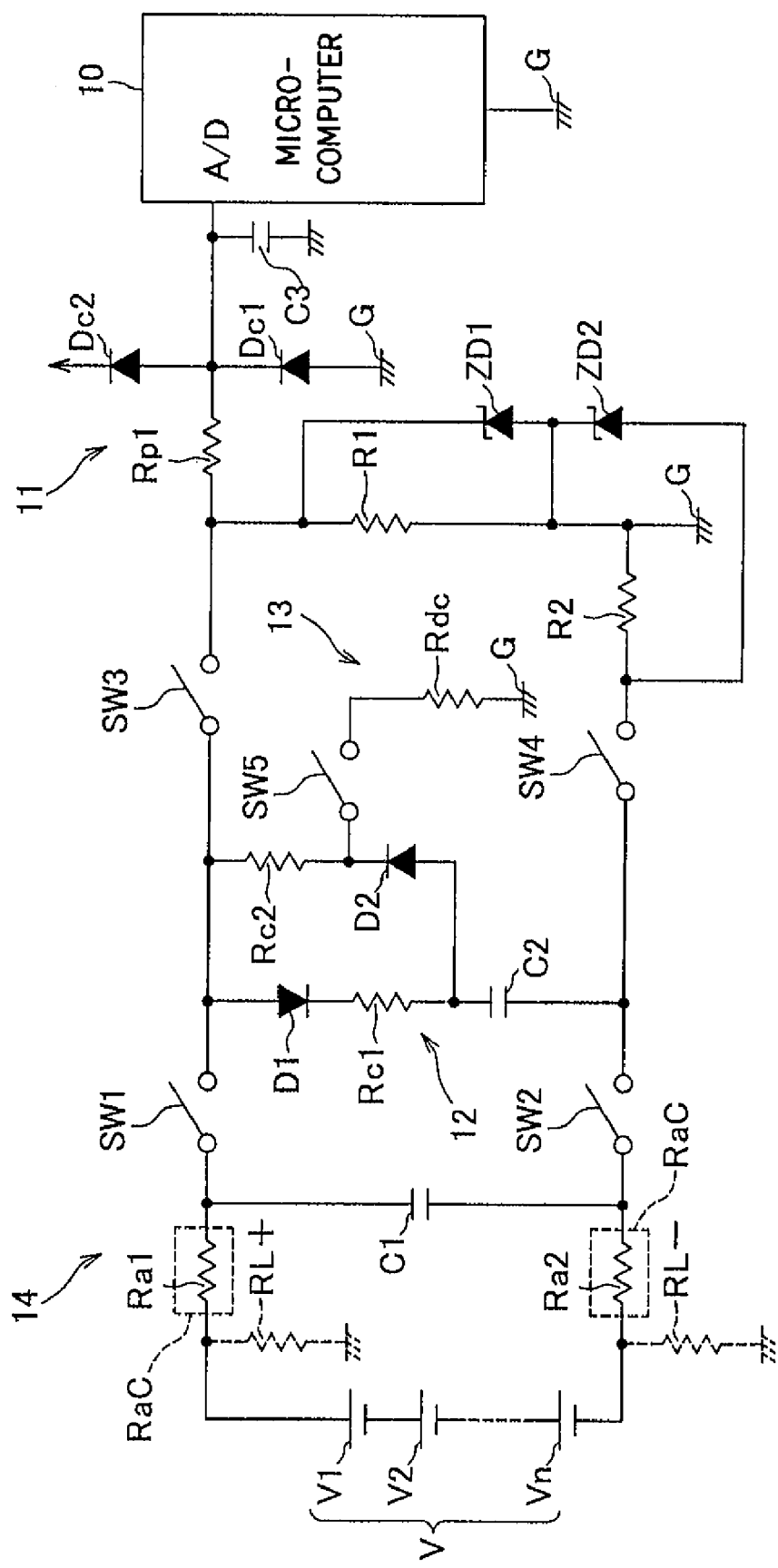
FIG. 3 is a circuit diagram showing a limiting resistor covered with a case.

When the rating of the limiting resistor Ra1 is not increased, a circuit can be closed by input of the insulation detecting apparatus so that the limiting resistor Ra1 is destroyed as discussed previously. Further, destroyed parts can be limited to the limiting resistor Ra1. Thereby, as shown in FIG. 3, by covering the limiting resistor Ra1 with a case, sound with destruction and burst of the limiting resistor Ra can be reduced, and a scatter of fragment can be prevented.

Figure 4:
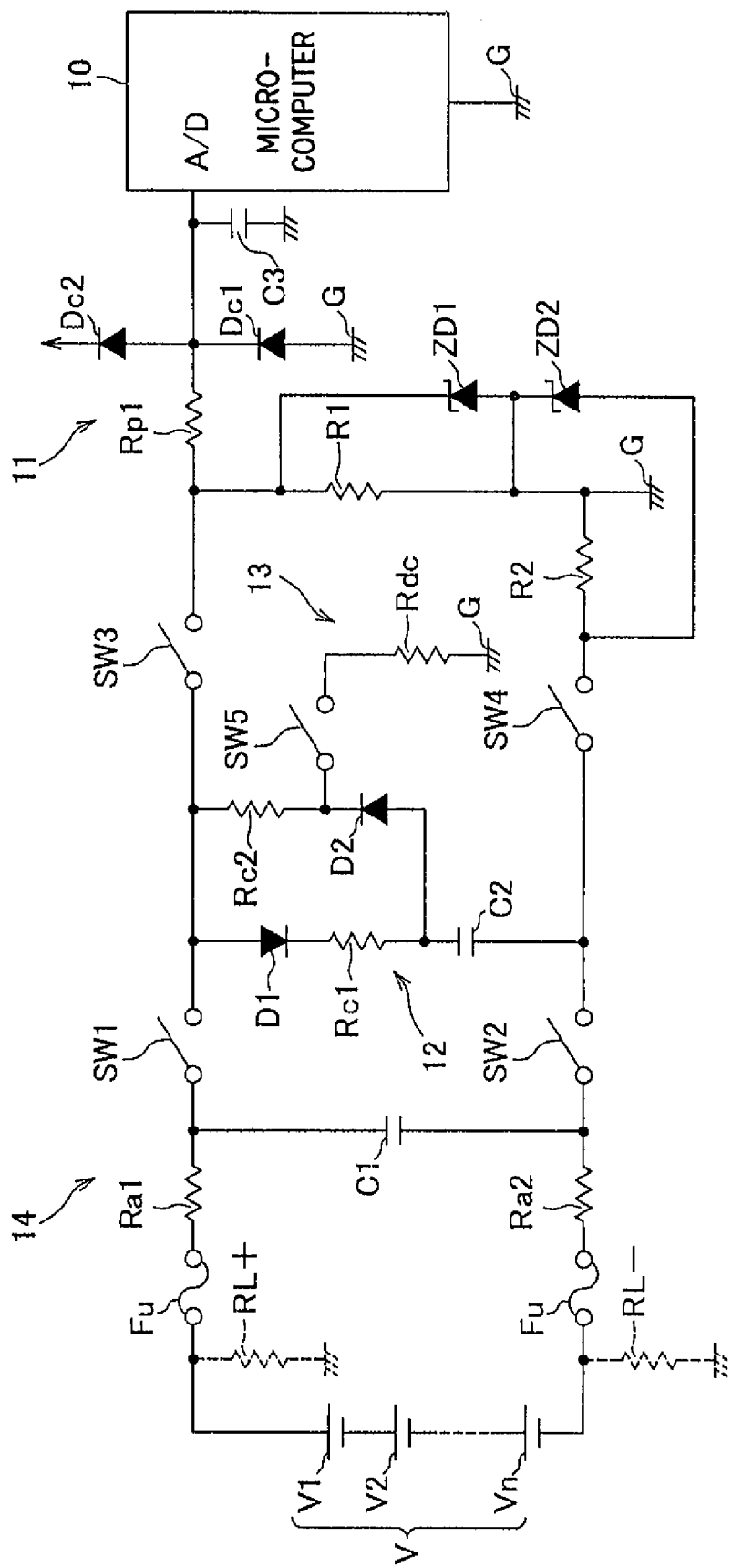
FIG. 4 is a circuit diagram providing a limiting resistor with a fuse.
Figure 5:
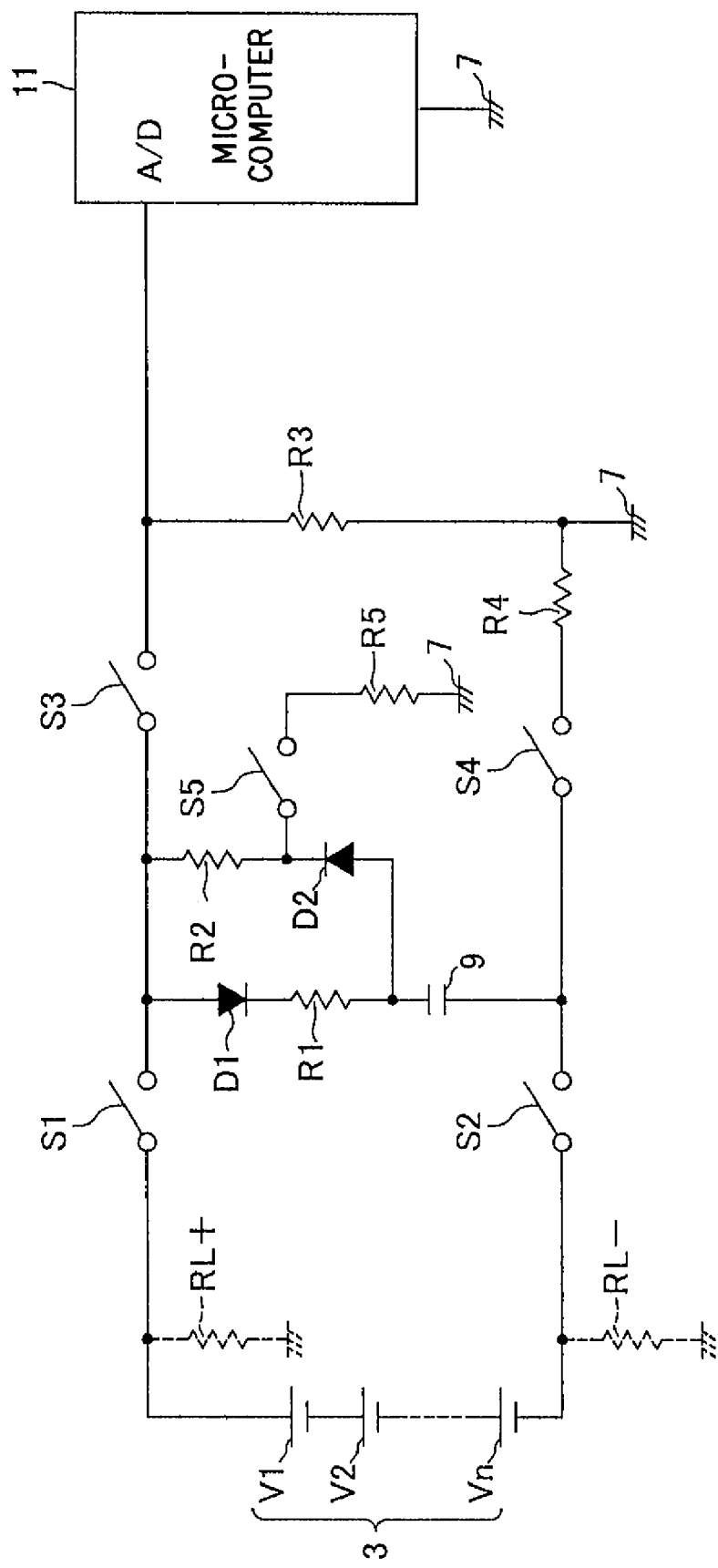
FIG. 5 is a circuit diagram of a conventional voltage detecting apparatus by prior art.

When excessive voltage is applied, an energization current increases. Therefore, as shown in FIG. 4, it is possible to protect the insulation detecting apparatus without an increase of rating of the limiting resistor Ra1 by inserting a fuse Fu between the high-voltage power source V and the limiting resistor Ra1.

Additionally, an energization current with increase of temperature of the limited resistor Ra1 can be limited by connecting a PTC (Positive Temperature Coefficient) thermistor to the limiting resistor Ra1 in series. Thereby, malfunctions of all parts including the limiting resistor Ra1 can be prevented, or a malfunction condition can be reduced.

Also, by performing as with the limiting resistor Ra1, a malfunction of the limiting resistor Ra2 can be avoided, or a scatter of fragment can be prevented when the limiting resistor Ra2 is destroyed.

According to the above insulation detecting apparatus, the first zener diode ZD1 is connected to the first resistor R1 in parallel. The first resistor R1 divides a voltage stored with the capacitor C2 as a flying capacitor into a detectable voltage at the microcomputer 10. In addition, over the zener voltage of the first zener diode ZD1 is not applied to input of the microcomputer 10. Therefore, for example, although the first switch SW1 connecting the high-voltage power source V with the capacitor C2 is in a malfunction by short-circuit and the microcomputer 10 is destroyed, whole functions of the insulation detecting apparatus do not stop by the destroyed microcomputer 10.

Moreover, by providing insulation detecting apparatus with the first zener diode ZD1, for example, even if the first switch SW1 is in a malfunction by short-circuit, a high-voltage of the high-voltage power source V is applied to only the limiting resistor Ra1 arranged on input of the insulation detecting apparatus. Thereby, it is possible to miniaturize other electric parts. Especially, since a resistor except the limiting resistor Ra1 can use a high-accuracy resistor instead of a lead resistor of noncombustible exterior equipment, it is possible to detect a voltage with high-accuracy.

Also, since the zener voltage of the zener diode ZD1 is larger than a maximum voltage which can be inputted to A/D port of the microcomputer 10, and is equal to or smaller than a maximum voltage applied to the first resistor R1, the insulation detecting apparatus can avoid decrease of voltage detection accuracy by leakage current of the zener diode ZD1, and can protect the microcomputer 10.

In the above embodiment, a short-circuit malfunction of the first switch SW1 is explained. Similarly, when the second switch SW2 is in a short-circuit malfunction, by effect of the second zener diode ZD2, only voltage of the zener diode or less is applied to the second resistor R2. Therefore, a stop of all functions by the destroyed microcomputer 10 can be avoided.

The above described embodiments are only exemplary but not limited thereto. Any modifications and alterations thereof are within the scope of the present invention.

What is claimed is:

1. A voltage detecting apparatus comprising:
a direct-current power source insulated from a ground electric potential;
a flying capacitor storing an electric charge from the direct-current power source;
an input device constituted of a first input device and a second input device, the first input device being disposed between one terminal of the flying capacitor and a positive electrode of the direct-current power source, and the second input device being disposed between the other terminal of the flying capacitor and a negative electrode of the direct-current power source;
a voltage divider dividing a voltage across the flying capacitor;
a voltage detecting device connected to a ground electric potential and detecting the voltage across the flying capacitor divided by the voltage divider, an output device constituted of a first output device and a second output device, the first output device being disposed between one terminal of the flying capacitor and a positive electrode of the voltage detecting device, and the second output device being disposed between the other terminal of the flying capacitor and a negative electrode of the voltage detecting device wherein the input device has a current limiting device for preventing more than a prescribed current from flowing into the input device, wherein the voltage divider is constituted of a first resistor (R1) arranged between the first output device and the ground electric potential and a second resistor (R2) arranged between the second output device and the ground electric potential, wherein a first protective device is arranged between a positive electrode of the direct-current power source and the ground electric potential to prevent more than a prescribed voltage from applying to the first resistor and the voltage detecting device, wherein a second protective device is arranged between a negative electrode of the direct-current power source and the ground electric potential to prevent more than a prescribed voltage from applying to the second resistor, wherein the first protective device and the second protective device are placed after the first output device and the second output device, and wherein the first protective device is arranged in parallel with the first resistor of the voltage divider, and the second protective device is arranged in parallel with the second resistor of the voltage divider.

2. The voltage detecting apparatus as claimed in claim 1, wherein the protective device is a zener diode.

3. The voltage detecting apparatus as claimed in claim 2, wherein a zener voltage of the zener diode is larger than a maximum voltage detected by the voltage detecting device, and is equal to or smaller than a maximum voltage applied to the input device, the output device and the voltage divider.

4. The voltage detecting apparatus as claimed in claim 1, wherein the current limiting device is covered with a case for preventing fragments from flying in all directions.

5. The voltage detecting apparatus as claimed in claim 2, wherein the current limiting device is covered with a case for preventing fragments from flying in all directions.

6. The voltage detecting apparatus as claimed in claim 3, wherein the current limiting device is covered with a case for preventing fragments from flying in all directions.

* * * * *